United States Patent [19]
Knierim et al.

[11] Patent Number: 5,459,466
[45] Date of Patent: Oct. 17, 1995

[54] METHOD AND APPARATUS FOR CONVERTING A THERMOMETER CODE TO A GRAY CODE

[75] Inventors: Daniel G. Knierim; Scott L. Williams; Keith H. Lofstrom, all of Beaverton, Oreg.

[73] Assignee: Tektronix, Inc., Wilsonville, Oreg.

[21] Appl. No.: 393,530

[22] Filed: Feb. 23, 1995

Related U.S. Application Data

[63] Continuation of Ser. No. 88,976, Jul. 8, 1993, abandoned.

[51] Int. Cl.⁶ .................................................. H03M 7/16
[52] U.S. Cl. ........................... 341/160; 341/97; 326/43
[58] Field of Search .................... 341/96, 97, 156, 341/159, 160; 307/455, 494; 326/43; 327/561

[56] References Cited

U.S. PATENT DOCUMENTS

| | | | |
|---|---|---|---|
| 4,386,339 | 5/1983 | Henry et al. | 341/159 |
| 4,509,036 | 4/1985 | Furihata | 341/159 |
| 4,586,025 | 4/1986 | Knierim | 341/96 |
| 4,733,220 | 3/1988 | Knierim | 341/96 |
| 5,126,742 | 6/1992 | Schmidt et al. | 341/156 |
| 5,170,079 | 12/1992 | Komatsu et al. | 307/455 |
| 5,307,067 | 4/1994 | Kimura et al. | 341/159 |
| 5,315,176 | 5/1994 | Popescu | 307/455 |

*Primary Examiner*—Howard L. Williams
*Attorney, Agent, or Firm*—John Smith-Hill; Boulden G. Griffith

[57] ABSTRACT

A first subset of components of a first set of pairs of complementary differential electrical signals representative of a numerical value expressed in a multi-bit thermometer code, is processed in accordance with a first set of Boolean functions to produce a first set of output electrical signal components, and a second subset of components of the first set of pairs of complementary differential electrical signals is processed in accordance with a second set of Boolean functions to produce a second set of output electrical signal components. The first and second subsets and the first and second sets of Boolean functions are such that the first and second sets of output electrical signal components when combined form a second set of pairs of complementary differential electrical signals representative of the same numerical value expressed in a second multi-bit code with fewer bits than the multi-bit thermometer code.

15 Claims, 6 Drawing Sheets

METHOD AND APPARATUS FOR CONVERTING A THERMOMETER CODE TO A GRAY CODE

This application is a continuation of application Ser. No. 08/088,970 filed Jul. 8, 1993, which is now abandoned.

BACKGROUND OF THE INVENTION

This invention relates to a method and apparatus for converting a thermometer code to a Gray code.

A number may be represented by a thermometer code wherein each successive bit of a data word is assigned a progressively larger value, all of the bits having assigned values below or the same as the number being set to a logical true state, and all of the bits having values higher than the number being set to a logical false state. A common application of a thermometer code is in an analog-to-digital (A/D) converter, in which a voltage range is divided into a set of quantum levels and a comparator associated with each quantum level compares an analog input voltage with the voltage quantum reference, generating an output true state if the input voltage is higher than the voltage quantum reference. The outputs of all the comparators thus form the bits of a thermometer code representing the magnitude of the input voltage when arranged in order of the associated reference voltage quantum level magnitudes.

In comparison to most other commonly used codes, a thermometer code does not represent numbers efficiently in terms of the number of bits required. For instance, an 8-bit thermometer code can represent any one of 9 different numbers (including 0) while a typical 8-bit binary code can represent 256 different numbers. Therefore, the thermometer code output of an A/D converter is usually converted by an encoding circuit to a more compact and useful binary code before being transmitted as data to external circuits. Often, the desired binary code is a weighted, non-adjacent binary code.

U.S. Pat. No. 4,733,220 shows that advantages may arise from converting the thermometer code to a weighted, non-adjacent binary code by first converting the thermometer code to a non-weighted adjacent binary code, such as the well known Gray code, and then converting the non-weighted adjacent binary code to the desired weighted, non-adjacent binary code.

In a practical implementation of the circuit shown in U.S. Pat. No. 4,733,220, the thermometer code signals are in differential form and are converted to single-ended Gray code signals, and each single-ended Gray code signal is compared with a reference voltage to generate a differential Gray code signal.

Figure 1:
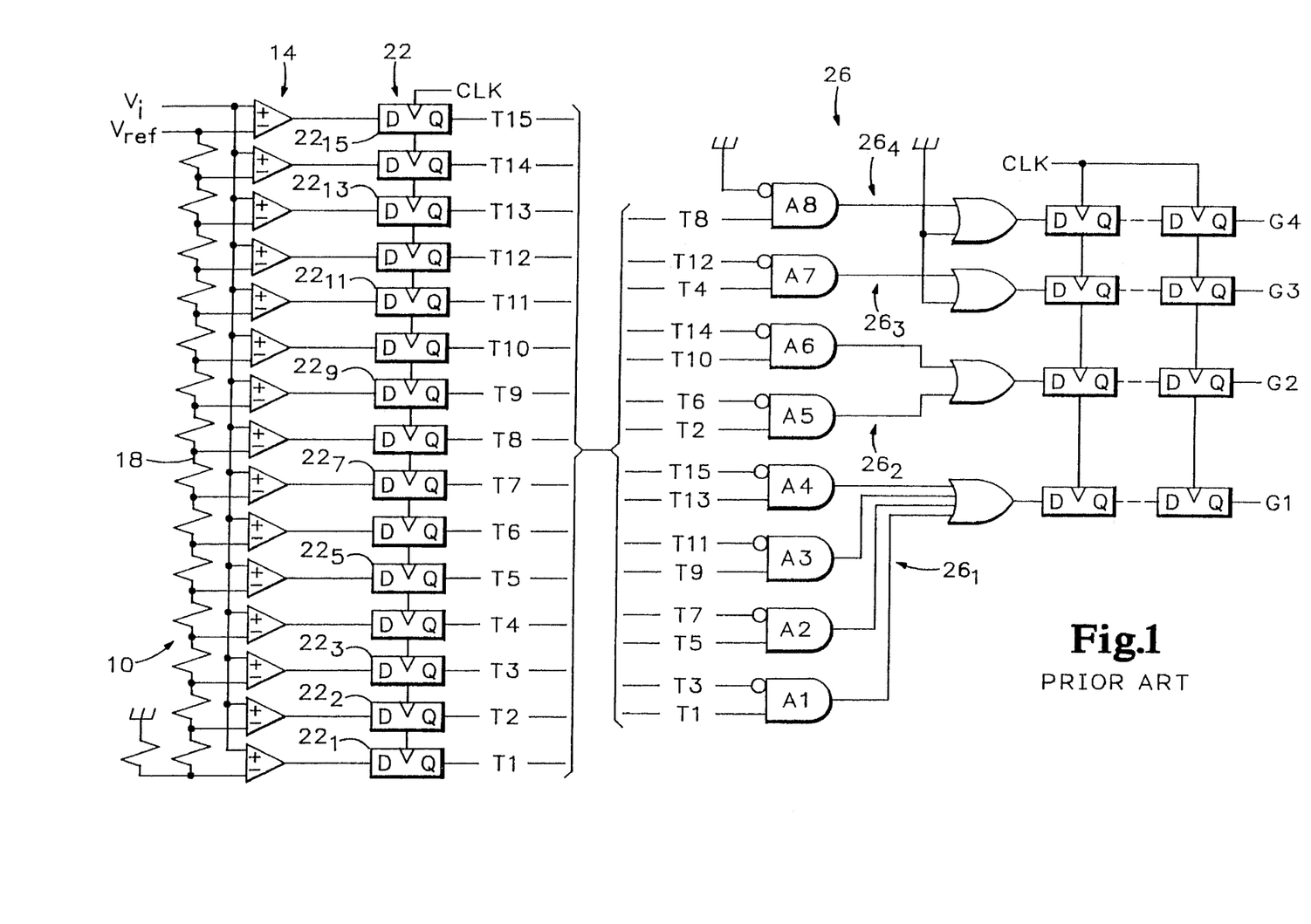
FIG. 1 is a block diagram of a known form of analog-to-Gray code converter.

FIG. 1 illustrates an analog-to-Gray converter in accordance with disclosure in U.S. Pat. No. 4,733,220. The converter comprises an analog-to-thermometer code converter 10, having a set of fifteen comparators 14 and a voltage divider network 18. The outputs of the comparators are applied to respective latches $22_1$–$22_{15}$, and the outputs of the latches are applied to a thermometer-to-Gray encoder 26. The thermometer-to-Gray encoder has four channels $26_1$–$26_4$, for the four Gray code bits G1–G4 respectively. The four channels of the thermometer-to-Gray encoder evaluate the following equations:

$$\left. \begin{array}{l} G1 = T1*\overline{T3} + T5*\overline{T7} + T9*\overline{T11} + T13*\overline{T15} \\ G2 = T2*\overline{T6} + T10*\overline{T14} \\ G3 = T4*\overline{T12} \\ G4 = T8 \end{array} \right\} \quad \text{Eq. 1}$$

where numerals with the prefix T represent thermometer code bits, numerals with the prefix G represent Gray code bits, a bar ( ‾ ) over a bit reference represents the negated bit reference, an asterisk (*) represents the AND function and a plus (+) represents the OR function. As described in U.S. Pat. No. 4,733,220, using Eq. 1 to calculate the Gray code values provides certain advantages with respect to propagation of metastable thermometer code bits.

FIG. 1 illustrates the thermometer code signals as being in single-ended form, but in a practical implementation of the analog-to-Gray converter shown in FIG. 1 the output signals provided by the comparators 14 are in differential form and consequently the bits $\overline{T3}$, $\overline{T7}$, $\overline{T11}$, etc. are provided explicitly rather than by negating the respective single-ended signals.

Figure 2:
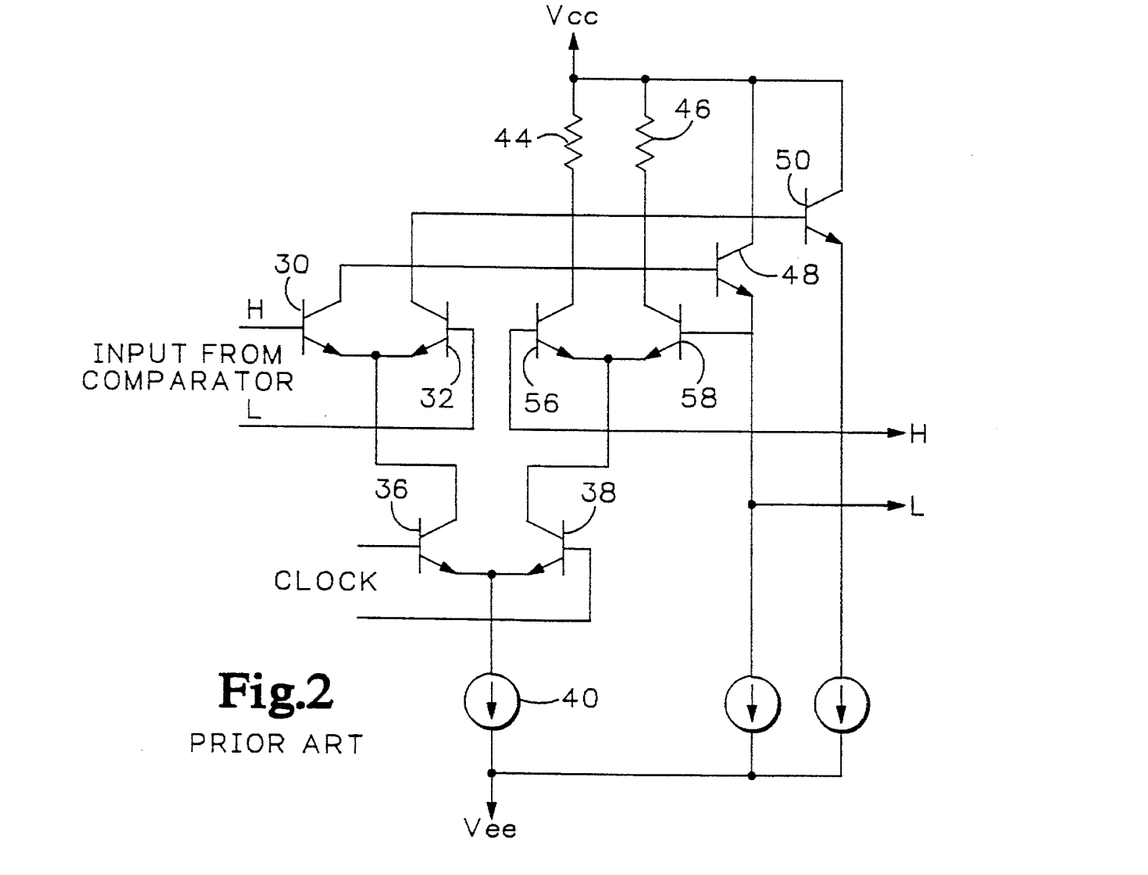
FIG. 2 is a schematic diagram of a portion of the analog-to-Gray code converter shown in FIG. 1.

FIG. 2 illustrates one of the latches of this practical implementation of the analog-to-Gray converter. The differential output signal provided by one of the comparators is applied to the differential pair 30, 32 and a differential clock signal is applied to the differential pair 36, 38. If the base of the transistor 30 is high when the base of transistor 36 goes high, i.e. the thermometer code is in the logic true state, the current source 40 supplies current from the Vcc rail through the resistor 44 and transistors 30 and 36. The voltage drop across resistor 44 holds emitter follower transistor 48 low, so the base of transistor 58 is low. Current source 40 does not supply current to resistor 46, so emitter follower 50 is high and the base of transistor 56 is high. The emitters of transistors 48 and 50 constitute the output of the latch. If the input signal received from the comparator is logic true, the emitter of transistor 48 is low and the emitter of transistor 50 is high. When the clock signal changes state, current source 40 supplies current through resistor 44 and transistors 56 and 38, so that the condition that existed when the base of transistor 36 was high is latched. Conversely, if the input signal was logic false when the base of transistor 36 went low, the emitters of the transistors 48 and 50 are latched high and low respectively.

Figure 3:
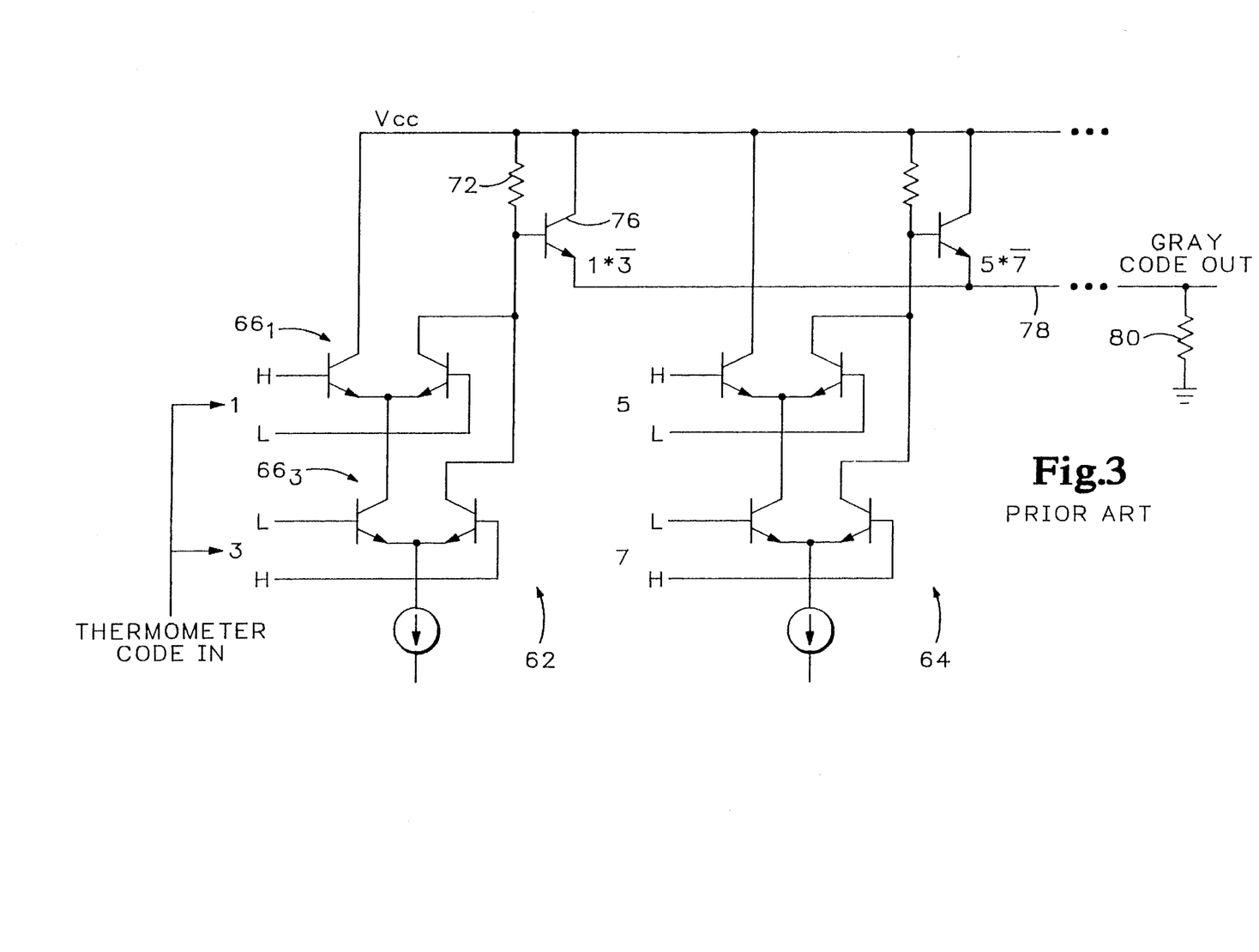
FIG. 3 is a partial schematic diagram of a second portion of the analog-to-Gray code converter shown in FIG. 1.

The outputs of latches $22_1$, $22_3$, $22_5$, $22_7$, $22_9$, $22_{11}$, $22_{13}$ and $22_{15}$ are connected to the channel $26_1$ of the thermometer-to-Gray encoder 26. The channel $26_1$ has four stages, of which two, designated 62 and 64, are shown in FIG. 3. Each stage comprises two differential pairs receiving the outputs of two latches. Thus, the output of the latch $22_1$ is connected to the differential pair $66_1$ and the output of the latch $22_3$ is connected through an appropriate level shifter to the differential pair $66_3$. The differential pair $66_1$ and $66_3$ of the stage 62 provide collector current to a load resistor 72, which is tapped by the emitter follower transistor 76. The transistor 76 supplies a current that varies in accordance with the function T1*T3 to a node 78. The emitter followers of the three other stages supply currents that vary in accordance with the functions T5*$\overline{T7}$, T9*$\overline{T11}$ and T13*$\overline{T15}$ respectively to the node 78, which is connected to ground through a pull-down resistor 80. The connections of the emitter followers to the node 78 accomplish a wire-or function, so that the current supplied to the node 78 develops a voltage across the pull-down resistor 80 representative of the single-ended Gray code signal G1. The voltage at the node 78 and a suitable reference voltage are applied to a differential input latch (not shown) which provides a differential Gray code signal that is then combined with the differential Gray code signals G2–G4 to provide a differential non-weighted adjacent binary code signal.

The thermometer-to-Gray encoder shown in FIG. 3 provides a single-ended output signal and accordingly is subject to the well known disadvantages relative to differential circuitry. For example, crosstalk between the Gray code signals and other signals within the A/D converter due to parasitic capacitances and/or power supply impedances is not canceled as it would be with differential signals. Further for a given noise margin, the single-ended signal swing must be twice that of the corresponding differential signal.

SUMMARY OF THE INVENTION

In accordance with a first aspect of the present invention there is provided a method of processing a first set of pairs of complementary differential electrical signals representative of a numerical value expressed in a multi-bit thermometer code, said method comprising processing a first subset of components of the first set of pairs of complementary differential electrical signals in accordance with a first set of Boolean functions to produce a first set of output electrical signal components, and processing a second subset of components of the first set of pairs of complementary differential electrical signals in accordance with a second set of Boolean functions to produce a second set of output electrical signal components, and wherein the first and second subsets and the first and second sets of Boolean functions are such that the first and second sets of output electrical signal components when combined form a second set of pairs of complementary differential electrical signals representative of said numerical value expressed in a second multi-bit code with fewer bits than the multi-bit thermometer code.

In accordance with a second aspect of the present invention there is provided an apparatus for processing a first set of pairs of complementary differential electrical signals representative of a numerical value expressed in a multi-bit thermometer code, said apparatus comprising means for processing a first subset of components of the first set of pairs of complementary differential electrical signals in accordance with a first set of Boolean functions to produce a first set of output electrical signal components, and means for processing a second subset of components of the first set of pairs of complementary differential electrical signals in accordance with a second set of Boolean functions to produce a second set of output electrical signal components, and wherein the first and second subsets and the first and second sets of Boolean functions are such that the first and second sets of output electrical signal components when combined form a second set of pairs of differential electrical signals representative of said numerical value expressed in a second multi-bit code with fewer bits than the multi-bit thermometer code.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

A set of functions that may be used for generating the complements of the single-ended Gray code signals indicated in Eq. 1 is:

$$\begin{aligned} \overline{G1} &= \overline{T1} + T3*\overline{T5} + T7*\overline{T9} + T11*\overline{T13} + T15 \\ \overline{G2} &= \overline{T2} + T6*\overline{T10} + T14 \\ \overline{G3} &= \overline{T4} + T12 \\ \overline{G4} &= \overline{T8} \end{aligned} \quad \text{Eq. 2}$$

From inspection of Eqs. 1 and 2, it can be seen that a given thermometer code doublet Ti, $\overline{Ti}$ is used in production of only one Gray code doublet. For example, the thermometer code doublet T1, $\overline{T1}$ is used in production of the Gray code doublet G1, $\overline{G1}$ and not in production of any of the other Gray code doublets. As explained in U.S. Pat. No. 4,733,220, this provides advantages with respect to the effect of a metastable state of a thermometer code signal on the Gray code signal. Also, since each element of the doublet Ti, $\overline{Ti}$ is used in producing only one element of the Gray code doublet, the signals representing the thermometer code doublets have a fan out of one and thus may be current signals.

Figure 4:
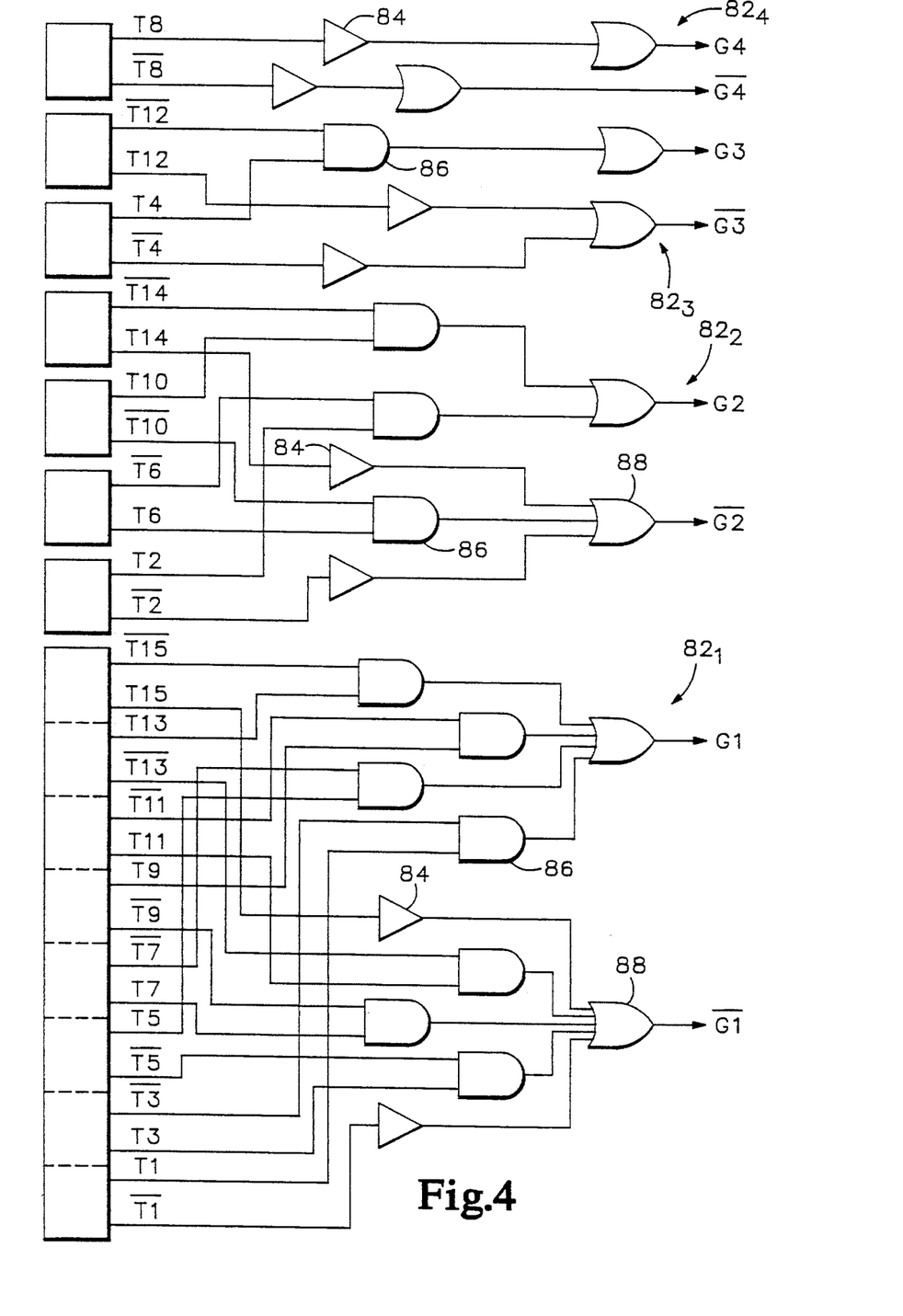
FIG. 4 is a logic block diagram of a thermometer-to-Gray encoder that is in accordance with the present invention and provides differential Gray code output signals.

The encoder shown in FIG. 4 implements Eqs. 1 and 2 and therefore separately calculates the two components of each Gray code doublet. Equation 1 is implemented using one subset of the complementary differential thermometer code inputs, while equation 2 is implemented using another subset of the those inputs, with these two subsets being mutually exclusive and yet together including all of the available inputs. The encoder has four channels $82_1$–$82_4$, for calculating the four doublets respectively. The encoder channels $82_1$–$82_3$ are composed of data buffers 84, AND gates 86 and OR gates 88. The channel $82_4$ includes data buffers and OR gates to preserve proper timing relative to the channels $82_1$–$82_3$. Similarly, the channel $82_3$ employs a single-input OR gate for preserving proper timing of the signal G3. If the potential divider had an extra resistor, and there were an extra comparator and an extra latch, providing an overflow thermometer code doublet T16, $\overline{T16}$, an additional encoder channel could be included to provide an overflow Gray code doublet G5, $\overline{G5}$. The additional encoder channel would be functionally the same as the channel $82_4$.

The logic block diagram shown in FIG. 4 may be implemented using latches as shown in FIG. 2 and combinational logic circuits similar to that shown in FIG. 3. However, a preferred implementation of one of the encoder channels is illustrated schematically by way of example in FIG. 5.

Figure 5:
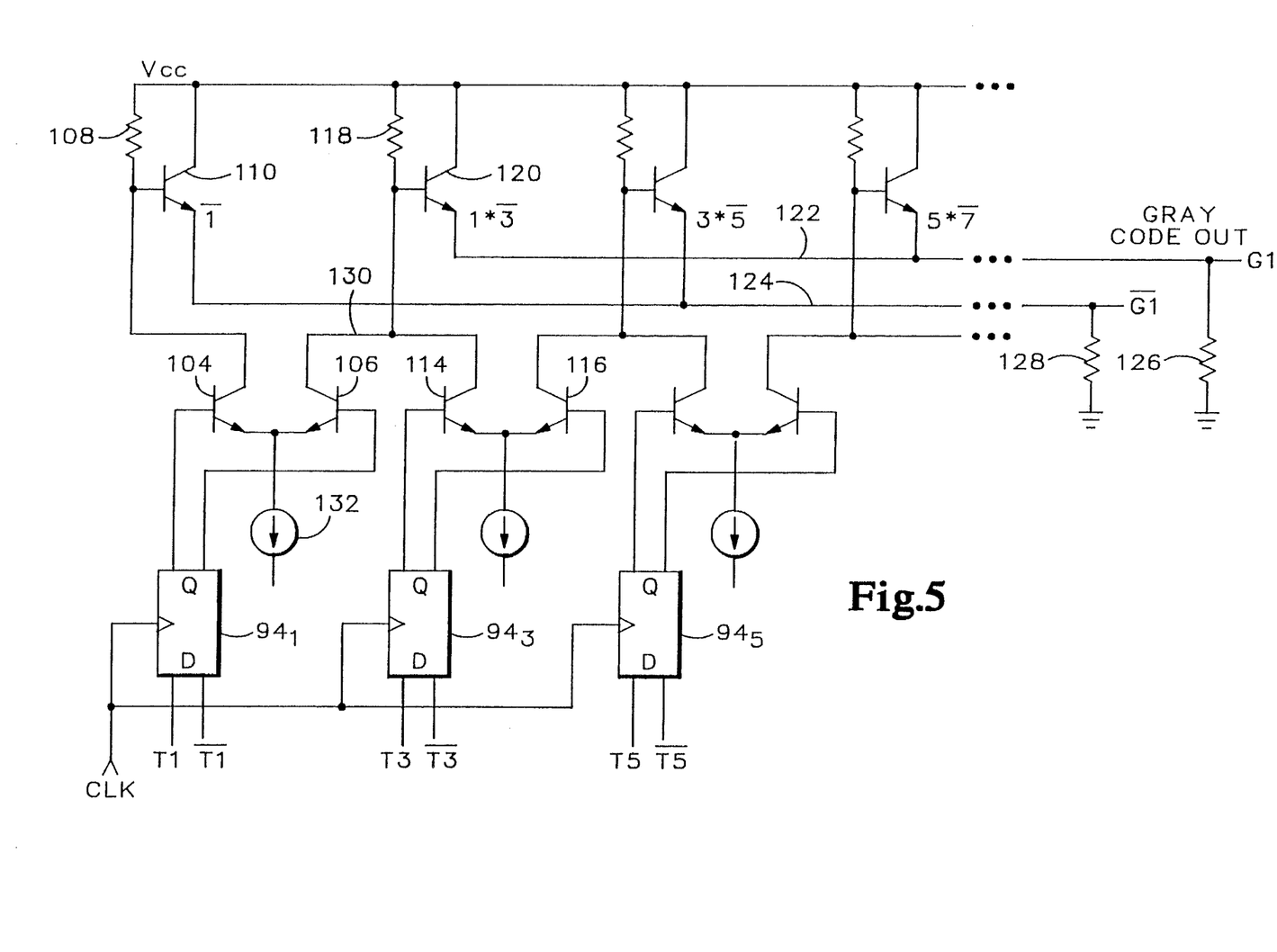
FIG. 5 is a partial schematic diagram of a thermometer-to-Gray encoder in accordance with the present invention.

FIG. 5 shows the encoder channel $82_1$, which generates the Gray code doublet G1, $\overline{G1}$. The encoder channel $82_1$ is an emitter-coupled logic circuit comprising a latch 94 and a differential pair and associated current source for each thermometer code doublet that is used in generating the Gray code doublet G1, $\overline{G1}$. Each latch 94 provides a voltage output and may be as shown in FIG. 2. The output of the latch $94_1$ is representative of T1, $\overline{T1}$ and is connected to the differential pair 104,106, which converts the voltage signals to current signals. The collector of transistor 104 is connected to the Vcc rail through a load resistor 108 that is tapped by an emitter follower 110, and the emitter current of the transistor 110 represents the value T1. The latch $94_3$, which provides voltage signals representative of T3, $\overline{T3}$, has its output connected to the bases of transistors 114, 116. The collectors of the transistors 106 and 114 are connected to a node 130, which is connected to the Vcc rail through a load resistor 118 that is tapped by an emitter follower 120. It will be understood by those skilled in the art that interconnection of the collectors of npn transistors 106,114 at the node 130 implements a wire-AND function, in that no current flows through the resistor 118 (logic true) only if transistors 106 and 114 each have no collector current. Accordingly, the emitter current of the transistor 120 represents the value $\overline{T1}*\overline{T3}$. Other stages of the encoder channel $82_1$ provide currents representative of the values $T3*\overline{T5}$, $T5*\overline{T7}$, $T7*T9$, $T9*\overline{T11}$, $T11*\overline{T13}$, $T13*\overline{T15}$ and T15. The currents T1*T3, T5*T7, T9*T11 and T13*T15 are supplied to a node 122, which is connected to ground through a pull-down resistor 126, and the currents $\overline{T1}$, $T3*\overline{T5}$, $T7*\overline{T9}$, $T11*\overline{T13}$ and T15 are supplied to a node 124, which is connected to ground through a pull-down resistor 128. Interconnection of the emitters of the npn transistors that are connected to the node 122 implements a wire-OR function, so that the total current supplied to the node 122 develops a voltage across the pull-down resistor 126 representative of the value $\overline{T1}*\overline{T3}+T5*\overline{T7}+T9*\overline{T11}+T13*\overline{T15}$, which is equal to G1. Similarly, the total current supplied to the node 124 develops a voltage across the pull-down resistor 128 representative of the value $\overline{G1}$. Thus, by separately generating the values G1 and $\overline{G1}$, the differential Gray code doublet G1, $\overline{G1}$ is generated.

The encoder described with reference to FIGS. 4 and 5 has an advantage over an encoder based on FIG. 4 but including combinational logic circuits similar to those shown in FIG. 3, in that it requires fewer devices. A further improvement may be obtained by replacing each latch 94 of FIG. 5 and its associated differential pair and current source, e.g. the differential pair 104,106 and current source 132, with the circuit shown in FIG. 6.

Figure 6:
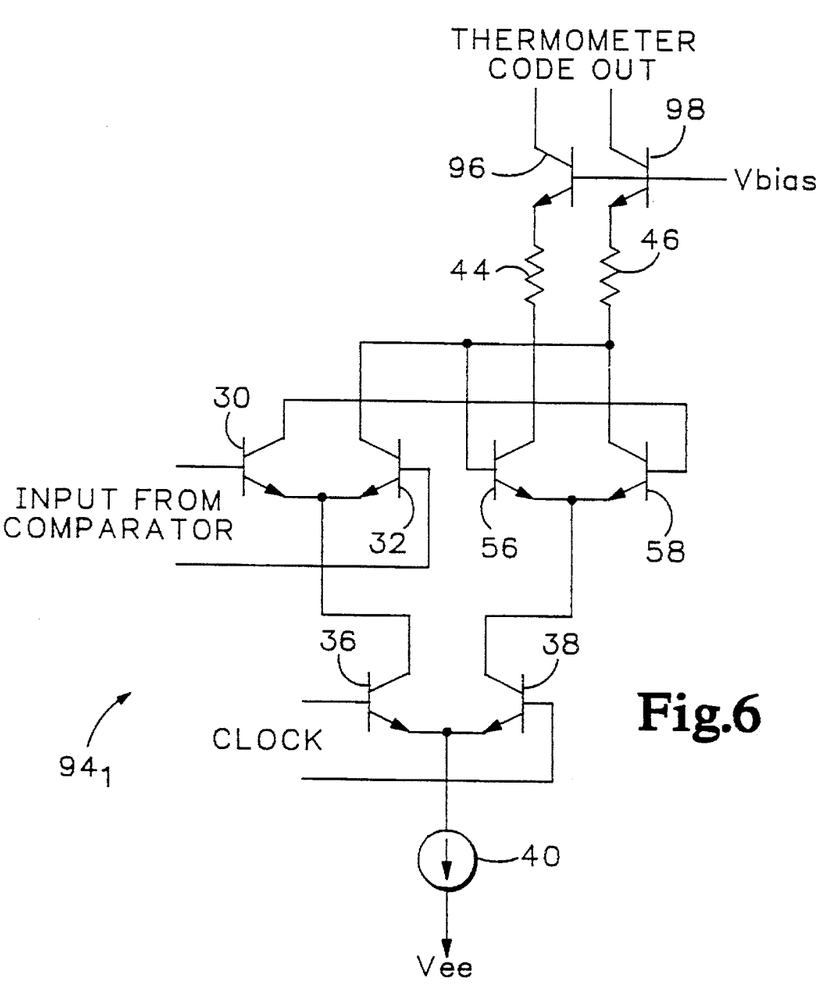
FIG. 6 is a schematic diagram of a circuit that may be used as part of the encoder shown in FIG. 5.

FIG. 6 illustrates a latch of which the input stage is essentially the same as the input stage of the latch shown in FIG. 2. However, the resistors 44 and 46, instead of being connected directly to Vcc, are connected to the emitters of common base transistors 96,98, whose collectors are connected to two of the load resistors shown in FIG. 5. Use of the circuit shown in FIG. 6 provides the advantage that the current that is used to latch the input thermometer code is also supplied to the load resistors in order to generate the Gray code output. Thus, whereas in the case of FIG. 2 the current signals provided by the differential pairs 30,32 and 56,58 are converted to voltage signals by the resistors 44, 46 and the emitter followers 48,50, and then converted back to current signals, by the differential pair 104,106, for example, in the case of FIG. 6 the current signals are provided directly to the load resistors.

Using Eqs. 1 and 2 for separately calculating the values Gj and $\overline{Gj}$ provides the proper Gray code values if the input signal is a legal thermometer code, i.e. one in which there are no out-of-sequence errors, as described in U.S. Pat. No. 4,586,025.

In accordance with the disclosure in U.S. Pat. No. 4,586,025, when a thermometer code includes an out-of-sequence error the ideal binary code should represent the number of logic ones in the illegal thermometer code. For example, the legal thermometer code 000 1111 1111 1111, containing twelve logic ones and therefore representing decimal 12, is converted to Gray 1010, and the illegal thermometer code 011 0011 1111 1111 which also contains twelve logic ones, should also be encoded as Gray 1010, but if it were encoded by use of Eqs. 1 and 2 it would return Gray 1101 or decimal 9. Thus, use of Eqs. 1 and 2 does not provide the ideal result if the thermometer code contains an out-of-sequence error. It should be noted that when an illegal thermometer code is converted to a Gray code by use of Eqs. 1 and 2, an indeterminate data bit might result, i.e. Gj and $\overline{Gj}$ may both be in the same state. However, the indeterminate bit will generally be resolved by regeneration and the error will be no worse than if single-ended signals had been employed.

U.S. Pat. No. 4,586,025 illustrates a technique for minimizing the effect of out-of-sequence errors in a thermometer code. In accordance with the disclosure in U.S. Pat. No. 4,586,025, the effect of out-of-sequence errors in a thermometer code is minimized by grouping the thermometer code signals into P subsets, the Nth (N=1 . . . P) subset comprising the Nth signal of the thermometer code and every Pth signal thereafter, whereby each signal subset represents a separate thermometer code. The P subsets of signals are applied as inputs to respective thermometer-to-binary encoders (each having multiple encoder channels), and the outputs of the thermometer-to-binary encoders are summed. Provided that the span of the out-of-sequence error is less than P, the input to each encoder will be free of out-of-sequence errors and the sum of the outputs of the encoders will be equal to the ideal approximation value of the out-of-sequence thermometer code. This technique may be used with the encoder described with reference to FIGS. 4 and 5 to minimize the effect of out-of-sequence errors.

It will be appreciated that the invention is not restricted to the particular embodiments that have been described, and that variations may be made therein without departing from the scope of the invention as defined in the appended claims and equivalents thereof.

We claim:

1. A method of processing a first set of pairs of complementary differential signals representative of a numerical value expressed in a multi-bit thermometer code, said method comprising:

processing a first subset of components of the first set of pairs of complementary differential electrical signals in accordance with a first set of Boolean functions to produce a first set of output electrical signal components, and processing a second subset of components of the first set of pairs of complementary differential electrical signals in accordance with a second set of Boolean functions to produce a second set of output electrical signal components, and wherein the first and second subsets and the first and second sets of Boolean functions are such that the first and second sets of output electrical signal components when combined form a second set of pairs of differential electrical signals representative of said numerical value expressed in a second multi-bit code with fewer bits than the multi-bit thermometer code, and wherein the first and second sets of Boolean functions produce complementary results in the second set of pairs of differential electrical signals for all legal thermometer codes but produce non-complementary results in the second set of pairs of differential electrical signals for at least some illegal thermometer codes.

2. A method according to claim 1, wherein the first and second subsets and the first and second sets of Boolean functions are such that said second multi-bit code is a Gray code.

3. A method according to claim 1 wherein the first and second sets of Boolean functions do not have any AND terms with more than two inputs.

4. A method according to claim 1 wherein the first and second sets of Boolean functions do not have any OR terms with more than two inputs.

5. A method according to claim 1 wherein the first and second sets of Boolean functions do not have any AND terms with more than three inputs.

6. A method according to claim 1 wherein the first and second sets of Boolean functions do not have any OR terms with more than three inputs.

7. Apparatus for processing a first set of pairs of complementary differential electrical signals representative of a numerical value expressed in a multi-bit thermometer code, said apparatus comprising:

means for processing a first subset of components of the first set of pairs of complementary differential electrical signals in accordance with a first set of Boolean functions to produce a first set of output electrical signal components, and means for processing a second subset of components of the first set of pairs of complementary differential electrical signals in accordance with a second set of Boolean functions to produce a second set of output electrical signal components, and wherein the first and second subsets and the first and second sets of Boolean functions are such that the first and second sets of output electrical signal components when combined form a second set of pairs of differential electrical signals representative of said numerical value expressed in a second multi-bit code with fewer bits than the multi-bit thermometer code, and wherein the first and second sets of Boolean functions produce complementary results in the second set of pairs of differential electrical signals for all legal thermometer codes but produce non-complementary results in the second set of pairs of differential electrical signals for at least some illegal thermometer codes.

8. Apparatus according to claim 7, wherein the means for processing the first subset of components and the means for processing the second subset of components comprises an emitter-coupled logic circuit.

9. Apparatus according to claim 8, wherein the emitter-coupled logic circuit comprises at least first and second pairs of differential current output ports, the first port of the first pair being coupled through a first resistor to a Vcc rail, and a first emitter follower tapping said first resistor and having its emitter connected to a first output of the circuit, and the second port of the first differential pair and the first port of the second pair being connected through a second resistor to the Vcc rail and a second emitter follower tapping said second resistor and having its emitter connected to a second output of the circuit.

10. Apparatus according to claim 9, wherein the emitter-coupled logic circuit comprises a third pair of differential current output ports and the second port of the second pair and the first port of the third pair are coupled through a third resistor to the Vcc rail and a third emitter follower taps the third resistor and has its emitter connected to the first output of the circuit.

11. Apparatus according to claim 9, comprising a plurality of latches, one for each pair of complementary differential electrical signals in the first set, and wherein each latch comprises a current source, first and second resistors, selection means responsive to a pair of complementary differential electrical signals of the first set to route current supplied by the current source either to the first resistor or to the second resistor, and first and second transistors having their emitters connected to the first and second resistors respectively and whose collectors constitute one of the pairs of differential current output ports.

12. An apparatus according to claim 7 wherein the first and second sets of Boolean functions do not have any AND terms with more than two inputs.

13. An apparatus according to claim 7 wherein the first and second sets of Boolean functions do not have any OR terms with more than two inputs.

14. An apparatus according to claim 7 wherein the first and second sets of Boolean functions do not have any AND terms with more than three inputs.

15. An apparatus according to claim 7 wherein the first and second sets of Boolean functions do not have any OR terms with more than three inputs.

* * * * *